(12) United States Patent
Wada et al.

(10) Patent No.: US 11,302,576 B2
(45) Date of Patent: Apr. 12, 2022

(54) METHOD OF MAKING A SEMICONDUCTOR DEVICE INCLUDING A GRAPHENE BARRIER LAYER BETWEEN CONDUCTIVE LAYERS

(71) Applicant: Tokyo Electron Limited, Tokyo (JP)

(72) Inventors: Makoto Wada, Nirasaki (JP); Takashi Matsumoto, Nirasaki (JP); Masahito Sugiura, Nirasaki (JP); Ryota Ifuku, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 20 days.

(21) Appl. No.: 16/822,210

(22) Filed: Mar. 18, 2020

(65) Prior Publication Data

US 2020/0303251 A1 Sep. 24, 2020

(30) Foreign Application Priority Data

Mar. 18, 2019 (JP) .............................. JP2019-050004

(51) Int. Cl.
*H01L 21/768* (2006.01)
*H01L 23/522* (2006.01)
*H01L 23/532* (2006.01)

(52) U.S. Cl.
CPC .. *H01L 21/76886* (2013.01); *H01L 21/76849* (2013.01); *H01L 23/5226* (2013.01); *H01L 23/53209* (2013.01); *H01L 23/53233* (2013.01); *H01L 23/53238* (2013.01); *H01L 23/53247* (2013.01); *H01L 23/53252* (2013.01); *H01L 23/53276* (2013.01)

(58) Field of Classification Search
None
See application file for complete search history.

(56) References Cited

U.S. PATENT DOCUMENTS

| | | | |
|---|---|---|---|
| 2009/0315182 A1 | 12/2009 | Besser et al. | |
| 2012/0228614 A1* | 9/2012 | Kitamura | H01L 21/76846 257/52 |
| 2014/0339700 A1 | 11/2014 | Ren et al. | |
| 2015/0235959 A1* | 8/2015 | Lee | H01L 23/53276 257/762 |
| 2019/0161351 A1* | 5/2019 | Song | C23C 16/50 |
| 2020/0071822 A1* | 3/2020 | An | C23C 16/26 |

FOREIGN PATENT DOCUMENTS

| | | |
|---|---|---|
| JP | 2013-251358 A | 12/2013 |
| JP | 2016-18899 A | 2/2016 |

* cited by examiner

*Primary Examiner* — Erik Kielin
(74) *Attorney, Agent, or Firm* — Nath, Goldberg & Meyer; Jerald L. Meyer; Tanya E. Harkins

(57) ABSTRACT

There is provided a semiconductor device including a first conductive layer formed on a substrate; a second conductive layer serving as a wiring layer and a barrier layer provided between the first conductive layer and the second conductive layer, wherein the barrier layer is made of a graphene film, and the second conductive layer includes a metal silicide compound, the metal silicide compound being provided so as to be in contact with the graphene film constituting the barrier layer.

7 Claims, 12 Drawing Sheets

FIG. 4

|  | Lattice Constant (nm) | Distance (nm) Graphene ⇒ Distance Between Adjacent Carbon Atoms Metal ⇒ Tetrahedral Position Distance | Misfit (%) |
|---|---|---|---|
| Graphene |  | 0.142 | — |
| Ni(FCC) | 0.352 | 0.144 | 1.315 |
| Co(FCC) | 0.354 | 0.145 | 1.775 |
| Cu(FCC) | 0.361 | 0.147 | 3.787 |
| Ru(HCP) | 0.271 | 0.156 | 10.184 |
| Pt(FCC) | 0.391 | 0.160 | 12.412 |
| Al(FCC) | 0.405 | 0.165 | 16.437 |
| Ag(FCC) | 0.409 | 0.167 | 17.587 |
| Ti(HCP) | 0.295 | 0.170 | 19.942 |

METHOD OF MAKING A SEMICONDUCTOR DEVICE INCLUDING A GRAPHENE BARRIER LAYER BETWEEN CONDUCTIVE LAYERS

CROSS-REFERENCE TO RELATED APPLICATION

This application is based upon and claims the benefit of priority from Japanese Patent Application No. 2019-050004, filed on Mar. 18, 2019, the entire contents of which are incorporated herein by reference.

TECHNICAL FIELD

The present disclosure relates to a semiconductor device and a method of manufacturing the same.

BACKGROUND

Cu is used as a low-resistance wiring material for state-of-the-art devices. However, as wiring becomes finer and thinner, wiring width and wiring height are becoming smaller than 41 nm, which is the mean free path of conduction electrons in Cu, and an increase in electrical resistivity becomes significant. In other words, the resistance of an entire wiring system is determined by the sum of volume resistance, interface scattering resistance, and grain boundary scattering resistance. The resistance factor due to the interface scattering and the resistance factor due to the grain boundary scattering are both proportional to the mean free path. Thus, with the miniaturization of wiring, Cu makes it difficult to sufficiently lower the resistance of the entire wiring system. The wiring resistance in metal wiring is determined by the electrical resistivity of the wiring metal and the length of the wiring. A delay (RC delay) of a signal flowing through a multilayer wiring becomes even more serious as the electrical resistivity increases. Since the RC delay is a major factor to lower the performance of an LSI device, it is desirable to suppress the increase in wiring resistance as much as possible.

In this regard, in recent years, wiring using a metal silicide compound has attracted attention as a new wiring material as a substitute for Cu wiring (e.g., Patent Document 1). The metal silicide compound has a higher volume resistivity (bulk resistivity) than that of a pure metal. However, since the mean free path of electrons flowing in a conductor is proportional to the reciprocal of the volume resistivity, the mean free path of the electrons in the metal silicide compound is shorter than that in the pure metal. As an example, for a Ni silicide compound, the volume resistivity is about 18 $\mu\Omega\cdot cm$, but the mean free path of the electrons is considered to be 2 nm. That is, since the frequency of interface inelastic scattering is reduced even in a fine wiring size, it is possible to suppress an increase in electrical resistance due to miniaturization. In addition, Patent Document 2 discloses forming a metal silicide on a conductive layer via a barrier metal layer.

PRIOR ART DOCUMENT

Patent Document

[Patent Document Japanese Laid-Open Patent Publication No. 2013-251358

[Patent Document Japanese Laid-Open Patent Publication No. 2016-018899

SUMMARY

According to an embodiment of the present disclosure, there is provided a semiconductor device including: a first conductive layer formed on a substrate; a second conductive layer serving as a wiring layer; and a barrier layer provided between the first conductive layer and the second conductive layer, wherein the barrier layer is made of a graphene film, and wherein the second conductive layer includes a metal silicide compound, the metal silicide compound being provided so as to be in contact with the graphene film constituting the barrier layer

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 4 is a view showing a distance between adjacent atoms of graphene of each metal element/the tetrahedral position distance of an FCC (HCP) metal, and misfit constants with respect to graphene.

DETAILED DESCRIPTION

Hereinafter, embodiments will be described in detail with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

[Structure of Semiconductor Device]

Figure 1:
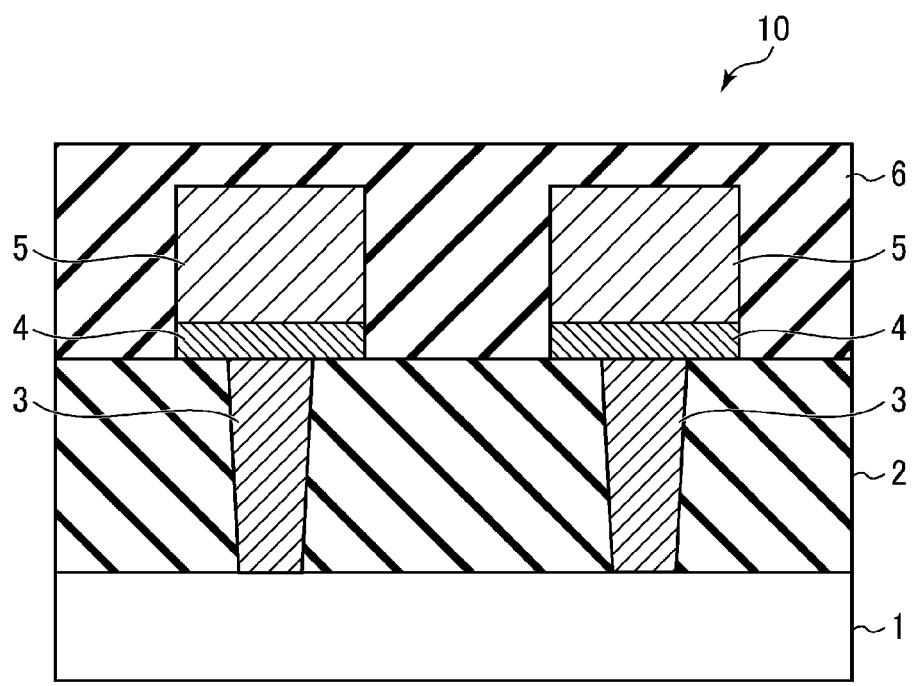
FIG. 1 is a cross-sectional view illustrating a semiconductor device according to a first embodiment.

FIG. 1 is a cross-sectional view illustrating a semiconductor device according to a first embodiment.

The semiconductor device 10 constitutes a wiring structure, and includes a substrate 1, a contact layer 3, a barrier layer 4 made of a graphene film, and a wiring layer 5 containing a metal silicide compound. A semiconductor element (not illustrated), such as a transistor or a capacitor, is formed on the substrate 1. The contact layer 3 functions as a first conductive layer, and connects the semiconductor element and the wiring layer 5. The barrier layer 4 is in direct contact with the contact layer 3 and the wiring layer 5 and functions as a diffusion barrier for these layers. The contact layer 3 is formed in a contact layer insulating film 2. In addition, a surface protection layer 6 is provided so as to cover the barrier layer 4 and the wiring layer 5.

As the substrate 1, a semiconductor substrate may be used, and a typical example thereof is a silicon substrate. The contact layer insulating film 2 may be made of any insulating material. For example, a $SiO_2$ film may be used. The contact layer 3 may be made of any conductive material. For example, a metallic material such as poly-Si, W, Cu, or Al may be used.

The surface protection layer 6 prevents diffusion of a metallic material used in the wiring structure and a role of preventing oxidation of graphene constituting the barrier layer 4 and a metal silicide compound constituting the wiring layer 5. In a case where a contact layer is formed on an upper-lying layer of the wiring structure, the surface protection layer 6 functions as an insulating film of the contact layer on the upper-lying layer. As the surface protection layer 6, for example, a $SiO_2$ film or a SiN film may be used. An air gap structure having a gap may be formed between the wirings.

The graphene film constituting the barrier layer 4 is a structure of an ultrathin film of two-dimensional crystal having a carbon six-membered ring structure, and has a quantized conduction characteristic (a ballistic conduction characteristic) and high electron mobility. In addition, since the graphene film also has a dense and flat atomic structure, high thermal conductivity, and chemical and physical stability, the graphene film has a high diffusion barrier property with respect to the contact layer 3 as an underlying layer and the wiring layer 5. Since the graphene film as an extremely thin film has high electron conductivity and an excellent diffusion barrier property, the graphene film may be applied as an optimal wiring barrier layer. Therefore, it is desirable to form a graphene film directly on an upper surface of the contact layer 3 without interposing a catalyst layer or the like on an underlying layer of the graphene film from the viewpoint of minimizing the contact resistance of LSI device wiring. In the present embodiment, a graphene film as the barrier layer 4 is directly formed on the upper surface of the contact layer 3, and the wiring layer 5 is formed directly on the barrier layer 4.

The wiring layer 5 functions as a second conductive layer. At least a portion in contact with the barrier layer 4 (the graphene film) in the wiring layer 5 is a metal silicide compound. The metal silicide compound is formed by reacting a metal film with a Si film. The graphene constituting the barrier layer 4 has a two-dimensional crystal, high flatness, and a plurality of graphene domains. For this reason, on the graphene film constituting the barrier layer 4, a metal is easily grown using the graphene domains. Thus, it is possible to form the metal constituting the metal silicide compound with a large particle size, and it is also possible to increase the particle size of the metal silicide compound after silicidation.

The resistance of the entire wiring system is determined by the sum of volume resistance, interface scattering resistance, and grain boundary scattering resistance. Although it is possible to reduce the interface scattering resistance in the wiring of the metal silicide compound, the grain boundary scattering resistance is a parameter independent of the interface scattering resistance and is added to the wiring resistance as it is. Accordingly, it is possible to reduce the grain boundary scattering resistance and thus reduce the wiring resistance by forming the barrier layer 4 as an underlying layer of the wiring layer 5 with a graphene film, and increasing the particle size of the metal silicide compound constituting the wiring layer 5 formed on the barrier layer 4.

The wiring layer 5 is responsible for electric conduction. The metal silicide compound constituting the wiring layer 5 may be any compound that is capable of realizing a sufficiently low resistance as wiring, and may be, for example, NiSi, CoSi, RuSi, $Cu_3Si$, PtSi, AlSi, AgSi, TiSi, WSi, or MoSi.

As the metal silicide compound, it is desirable that the metal element linked to silicon has a crystal structure of an FCC structure or an HCP structure, and that a tetrahedral position distance 6 of the metal element has less misfit with respect to an atomic distance between adjacent carbons ($\tau = 0.142$ nm) of the six-membered ring structure of the graphene layer.

Figure 2:
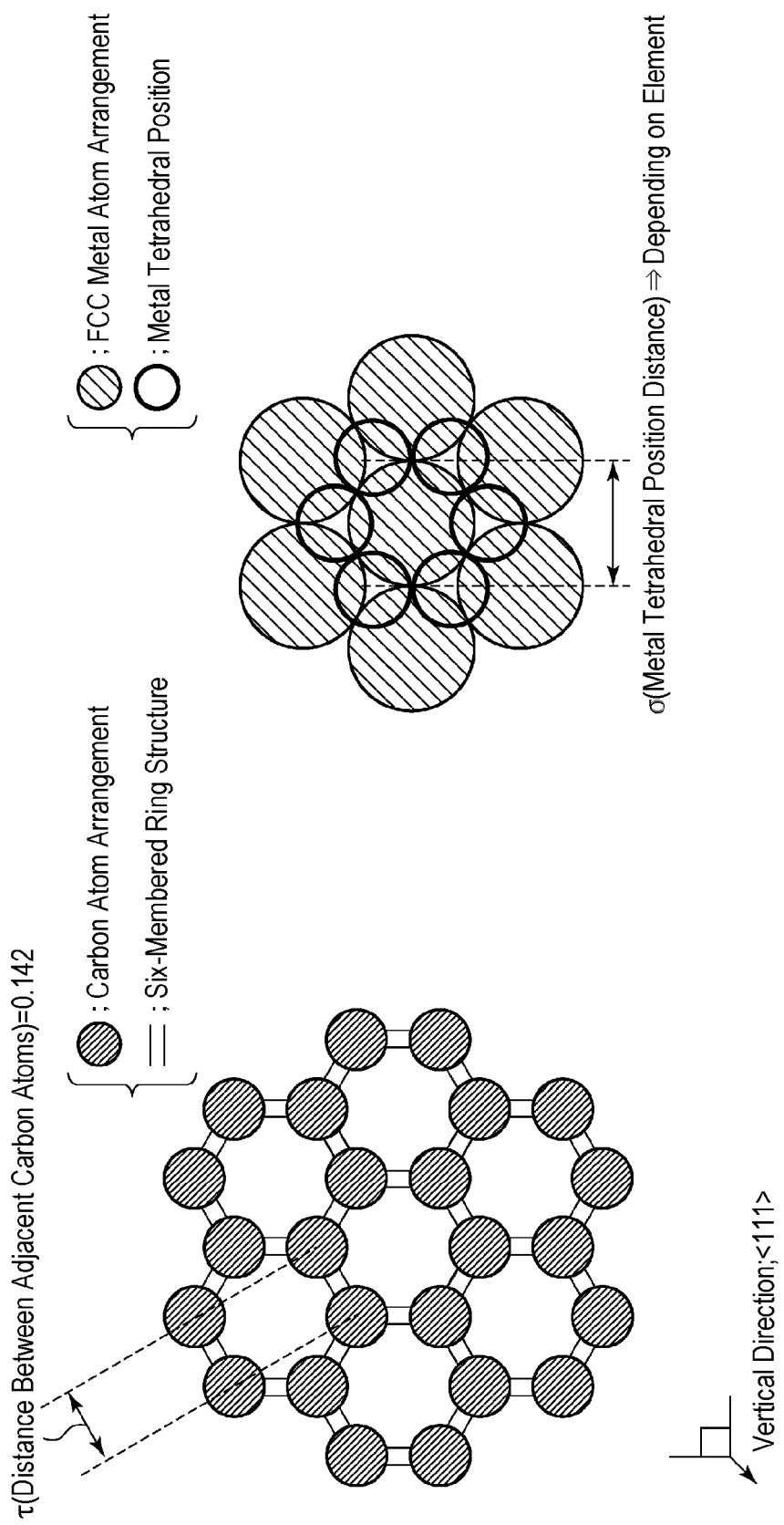
FIG. 2 is a schematic view illustrating the atomic arrangement of graphene and the FCC structure (111) close-packed plane atomic arrangement/(111) close-packed plane tetrahedral positions.
Figure 3:
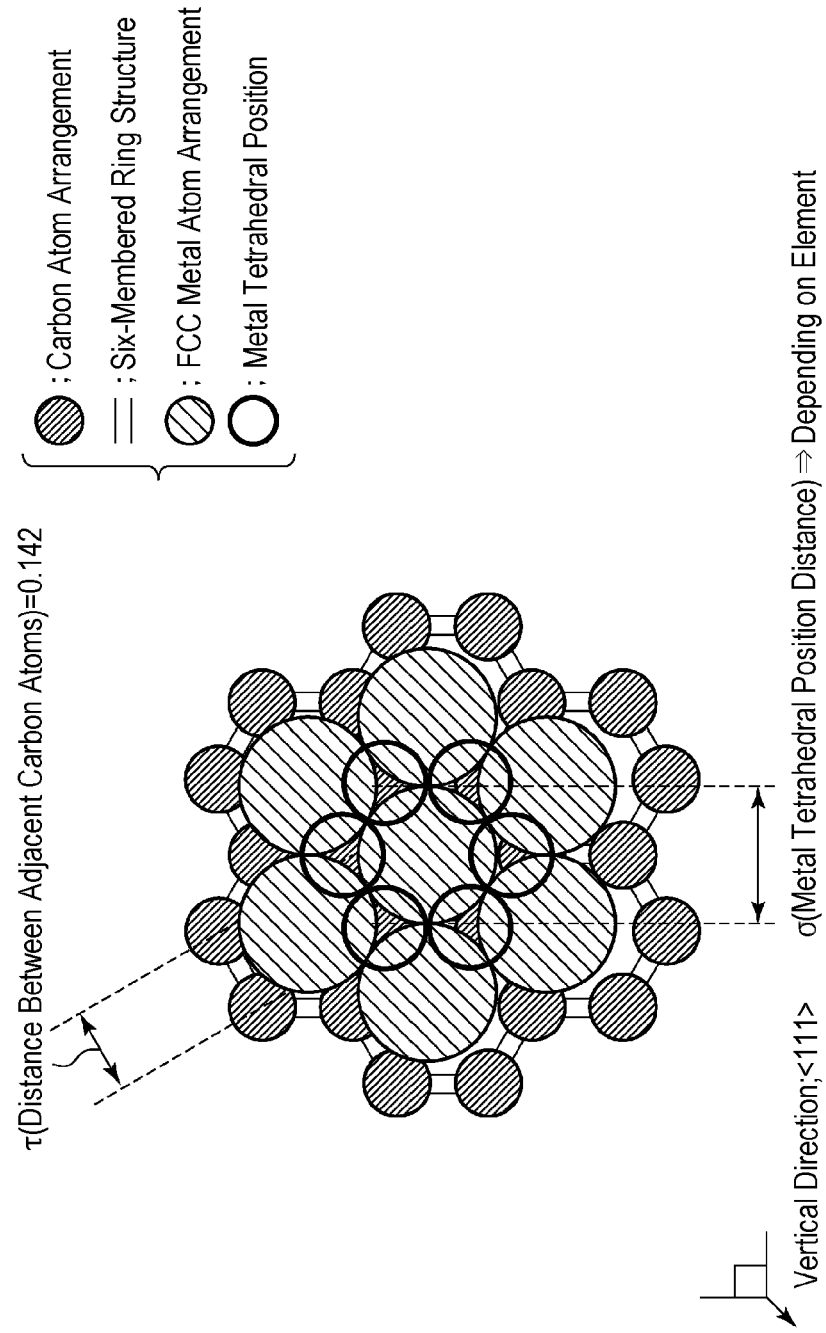
FIG. 3 is a schematic view illustrating a state in which an FCC metal film is formed such that graphene carbon atoms in an underlying layer are arranged at tetrahedral positions.

FIG. 2 is a schematic view illustrating an atomic arrangement of graphene and an FCC structure (111) close-packed plane atomic arrangement/(111) close-packed plane tetrahedral positions. A direction perpendicular to the paper in FIG. 2 is the <111> direction. In FIG. 2, τ is a distance between adjacent carbon atoms constituting graphene. The graphene has a carbon six-membered ring structure, and the distance ti between adjacent carbon atoms is 0.142 nm. Meanwhile, tetrahedral positions exist in a hexagonal shape on the (111) plane of the FCC metal. In the case of the FCC metal (111), the tetrahedral position distance σ is calculated by (1√6)×a (metal lattice constant). From the knowledge of metal crystallography, the tetrahedral positions of the FCC crystal lattice are interstitial sites having voids and has a low energy potential. Carbon atoms, which are light elements having a small atomic radius, are stably coordinated at the interstitial sites. For this reason, as illustrated in FIG. 3, the FCC metal film is formed such that the graphene carbon atoms as an underlying layer are arranged at tetrahedral positions, and the FCC (111) plane is formed on the graphene six-membered ring sheet structure with less misfit. At this time, the smaller the misfit between τ and σ, the higher the consistency. Therefore, since the FCC metal formed on the graphene undergoes a quasi-epitaxial growth, it is possible to form an FCC metal film having a larger crystal grain size. Similarly, the metal silicide compound obtained through a subsequent metal silicide reaction also has a larger crystal grain size. Since the close-packed plane atomic arrangement holds true with respect to a metal of the HCP structure, it is also possible to obtain the same effect with the metal of the HCP structure.

FIG. 4 is a view showing the distance between adjacent atoms of graphene of each metal element/the tetrahedral position distance of an FCC (HCP) metal, and misfit constant with respect to graphene. The misfit constants are calculated as ((σ−τ)/τ)×100%. In particular, a metal having a misfit constant of 15% or less has high consistency with graphene and thus can obtain a larger crystal grain size. As shown in FIG. 4, Ni, Co, Cu, Ru, and Pt have a misfit constant of 15% or less. These metals have a function of increasing a larger crystal grain size.

Al, Ag, and Ti, which are metal elements constituting AlSi, AgSi, and TiSi, respectively, have an FCC structure or an HCP structure, but have a misfit constant exceeding 15%. In addition, W and Mo, which are metal elements constituting WSi and MoSi, respectively, have a BCC structure. However, since these elements also undergo growth using a graphene domain, they can have a uniform crystal grain size increasing function.

[One Example of Semiconductor Device Manufacturing Method]

Next, an example of a method of manufacturing the semiconductor device of FIG. 1 will be described. FIGS. 5A to 5I are cross-sectional process views illustrating an example of the method of manufacturing the semiconductor device of FIG. 1.

Figure 5A:
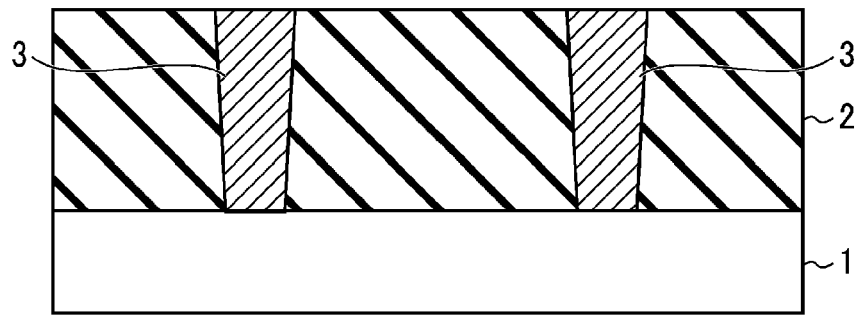
FIG. 5A is a cross-sectional process view illustrating an example of a method of manufacturing the semiconductor device of FIG. 1.

First, as illustrated in FIG. 5A, the contact layer insulating film 2 is formed on the substrate 1 on which a semiconductor element (not illustrated) such as a transistor or a capacitor is formed, holes are formed in the contact layer insulating film 2 through RIE etching, and the contact layer 3 for connecting the semiconductor element and the wiring layer is formed. For example, a SiO₂ film may be used for the contact layer insulating film, and a conductive material such as poly-Si, W, Cu, or Al may be used as a conductive material of the contact layer 3. The contact layer 3 may have a barrier metal layer for the purpose of preventing the diffusion of the conductive material. As a material of the barrier metal, for example, Ta, Ti, Ru, Mn, Co, or a nitride thereof may be used.

Figure 5B:
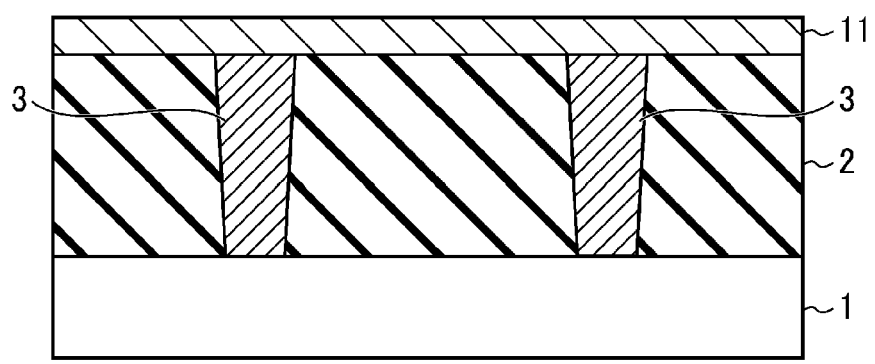
FIG. 5B is a cross-sectional process view illustrating an example of the method of manufacturing the semiconductor device of FIG. 1.

Subsequently, as illustrated in FIG. 5B, a graphene film 11 serving as a barrier layer is formed on the entire surface. The graphene film 11 may be formed directly on an upper surface of the contact layer 3. The formation of the graphene film 11 may be performed through a plasma-based CVD method.

Prior to the formation of the graphene film 11 through the plasma-based CVD method, plasma-based pretreatment may be performed for the purpose of cleaning and activating a front surface of the underlying layer. A hydrogen gas and a noble gas are preferable as a discharge gas at the time of the pretreatment. The discharge gas may be either one of the gases or a mixed gas containing both the gases. Processing temperature and plasma power may be appropriately changed depending on a state of the underlying layer. Further, heat treatment may be used as the pretreatment. The hydrogen gas and the noble gas are preferable as a gas for the heat treatment.

When forming the graphene film through the plasma-based CVD method, a hydrocarbon-based gas may be used as the discharge gas. The discharge gas may be the hydrocarbon gas alone or a mixed gas with another gas. The upper limit of the processing temperature is about 900 degrees C., and the lower limit thereof is about 300 degrees C. When the temperature falls below 300 degrees C., a growth rate is difficult to obtain, and thus graphene growth is limited. However, graphene growth occurs at the processing temperature of about 300 degrees C., and thus a uniform graphene film is formed. This temperature range is equal to or lower than a temperature at which a wiring process of a normal LSI device is performed, and is beneficial in affinity with a semiconductor process. In the formation of the graphene film, by removing ions and electrons and supplying only radicals to the substrate, a less damaged graphene domain with high continuity is obtained. From such a viewpoint, it is desirable to use remote plasma mainly composed of radicals and having a low electron temperature. In order to enlarge the graphene domain, a H₂ gas may be added to the discharge gas. The graphene film to be formed has an ultrathin film structure in which graphene is stacked from one layer to about ten or more layers. By forming the graphene film using the above-described plasma-based CVD method, it is possible to obtain a film that is particularly uniform.

Figure 5C:
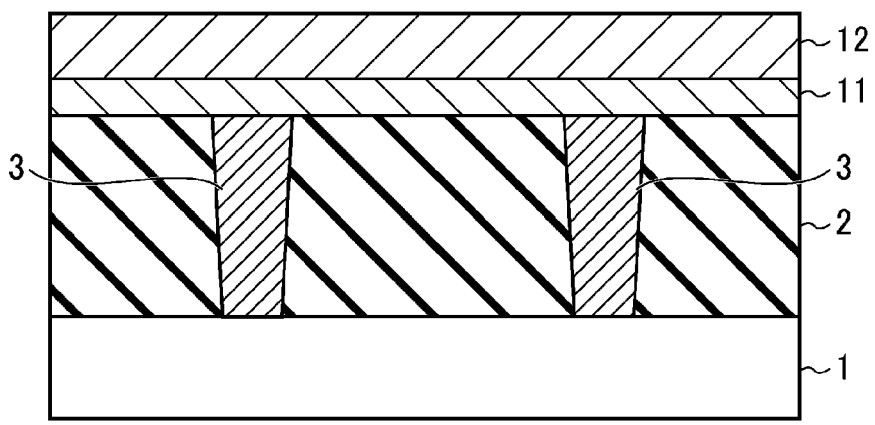
FIG. 5C is a cross-sectional process view illustrating an example of the method of manufacturing the semiconductor device of FIG. 1.

Subsequently, as illustrated in FIG. 5C, a metal film 12 for forming the wiring layer 5 is formed. The metal film 12 may be formed by the plasma-based CVD method or a sputtering method. As pretreatment prior to the formation of the metal film, plasma-based pretreatment may be performed for the purpose of cleaning and activating the front surface of the graphene film 11. A hydrogen gas or a noble gas is preferable as the discharge gas to be used in the plasma-based pretreatment. The metal film 12 is formed using the graphene domain of the underlying graphene film 11. In particular, in the case of the metal atoms having the FCC structure or the HCP structure, an FCC (111) plane or the like is formed on a graphene six-membered ring sheet structure in a pseudo-epitaxial manner with little misfit. Thus, in the initial step of film formation, it is desirable to form the metal film 12 at a film formation rate as low as possible. In the case of the plasma-based CVD method, it is effective to perform the initial step of film formation using an ALD method. Since the underlying graphene film 11 is very stable thermally, any temperature may be used as the film formation temperature.

The metal element constituting the metal film 12 may be any element capable of forming a metal silicide compound constituting the wiring layer 5. The metal element may be, for example, Ni, Co, Ru, Cu, Pt, W, Mo, or the like. By siliciding these metals, the above-mentioned NiSi, CoSi, RuSi, $Cu_3Si$, PtSi, WSi, and MoSi can be formed as metal silicide compounds.

As the metal element constituting the metal film 12, as described above, it is desirable that the metal element has a crystal structure of an FCC structure or an HCP structure, and that the tetrahedral position distance σ of the metal element has less misfit with respect to the atomic distance between adjacent carbons (τ=0.142 nm) of the six-membered ring structure of the graphene layer. In particular, Ni, Co, Cu, Ru, and Pt have a misfit constant of 15% or less, high consistency with graphene, and a large crystal grain size increasing function.

Figure 5D:
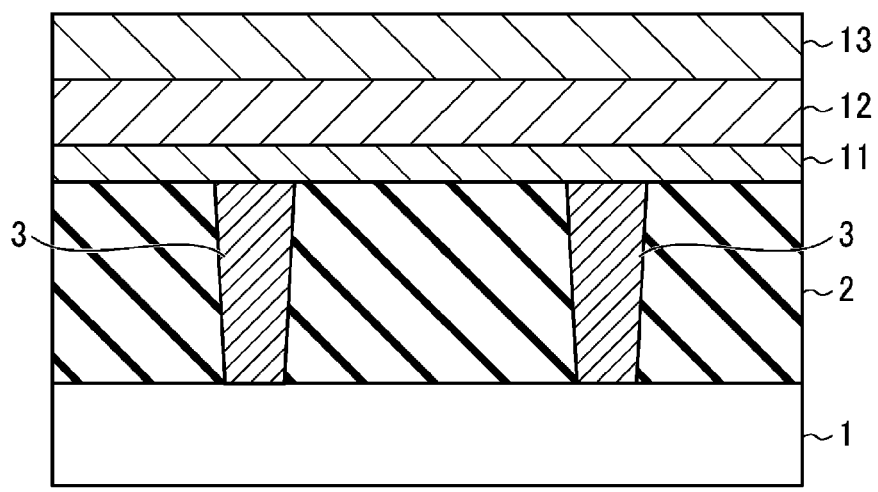
FIG. 5D is a cross-sectional process view illustrating an example of the method of manufacturing the semiconductor device of FIG. 1.

Subsequently, as illustrated in FIG. 5D, a Si film 13, which reacts with the metal film 12, is formed on the metal film 12. The Si film 13 may be formed using the plasma-based CVD method, whereby a poly-Si film or an amorphous Si film is formed as the Si film 13. For a stable metal silicide reaction, it is effective to perform a $H_2$ plasma-based pretreatment on the front surface of the metal film before forming the Si film.

Figure 5E:
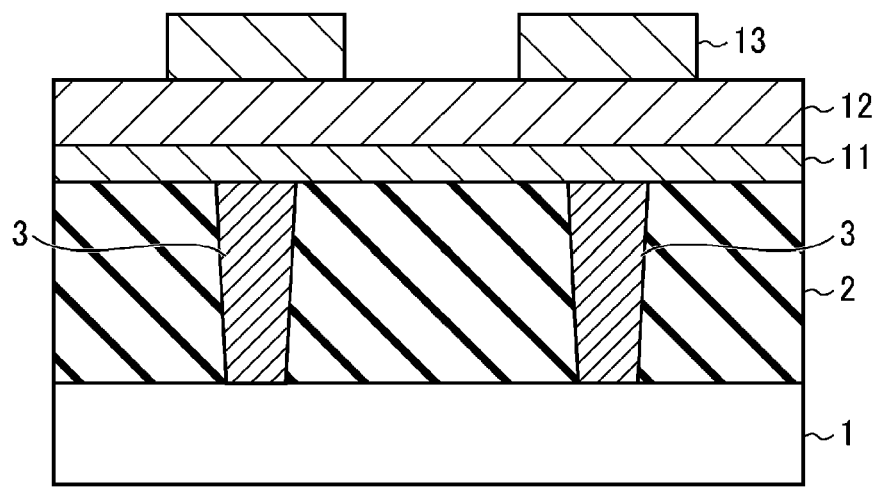
FIG. 5E is a cross-sectional process view illustrating an example of the method of manufacturing the semiconductor device of FIG. 1.

Subsequently, after performing a resist coating/lithography process (not shown), as illustrated in FIG. 5E, the Si film 13 is patterned into a wiring shape through dry etching (RIE process). The RIE process is performed using, for example, a $CF_4$ gas, a $SF_6$ gas, a $Cl_2$ gas, or the like. For the purpose of controlling the RIE shape, a TiN film, a SiN film, a $SiO_2$ film, or the like may be formed as a processing hard mask on the Si film 13.

Figure 5F:
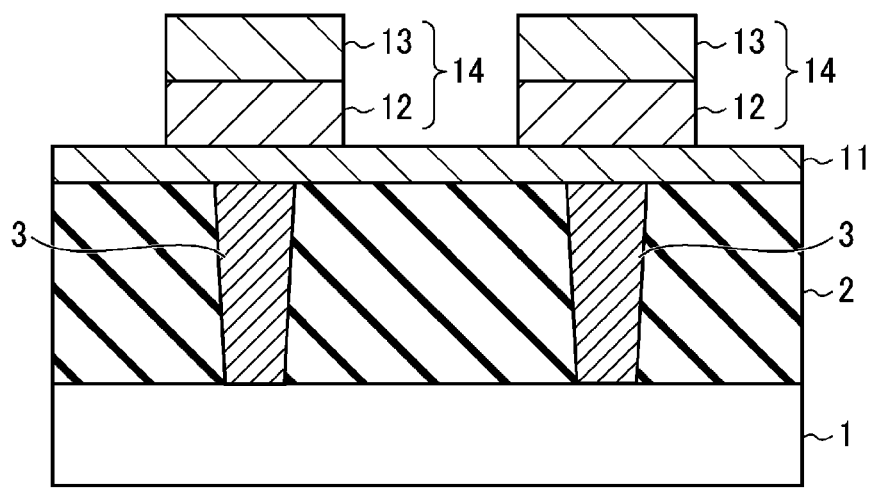
FIG. 5F is a cross-sectional process view illustrating an example of the method of manufacturing the semiconductor device of FIG. 1.

Subsequently, as illustrated in FIG. 5F, the metal film 12 is processed by a method capable of obtaining a processing selectivity with respect to the Si film 13. The processing method may be either dry etching (RIE process) or wet etching. Materials that are difficult to dry-etch, such as Co and Ni, may be subject to wet etching using, for example, $H_2SO_4+H_3PO_4$. By the processes of FIGS. 5E and 5F, a wiring pattern 14 having a stacked structure of the metal film 12 and the Si film 13 is formed.

Figure 5G:
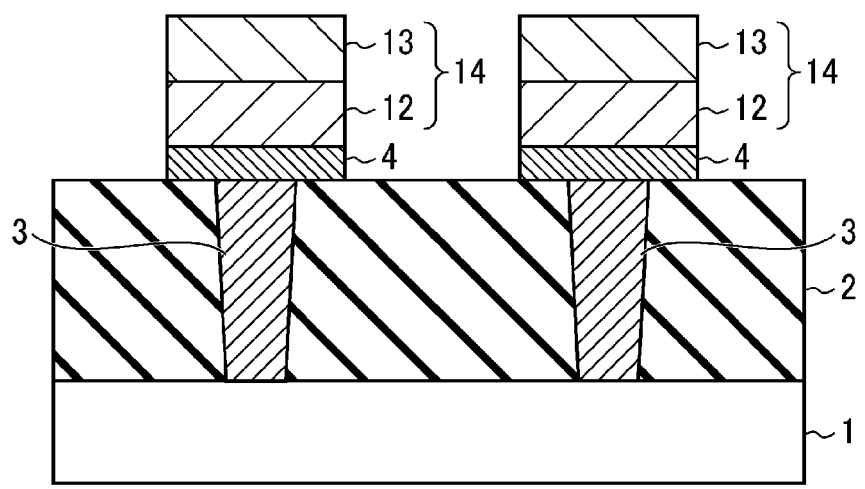
FIG. 5G is a cross-sectional process view illustrating an example of the method of manufacturing the semiconductor device of FIG. 1.

Subsequently, as illustrated in FIG. 5G, the graphene film 11 is subjected to an etching process. Thereby, the barrier layer 4 is formed. Since the graphene film 11 has extremely high resistance to a chemical liquid, process using the dry etching is preferable. As the dry etching, an $O_2$ plasma process, a $H_2$ plasma process, or a plasma process using a mixture of these gases and a noble gas may be used.

Figure 5H:
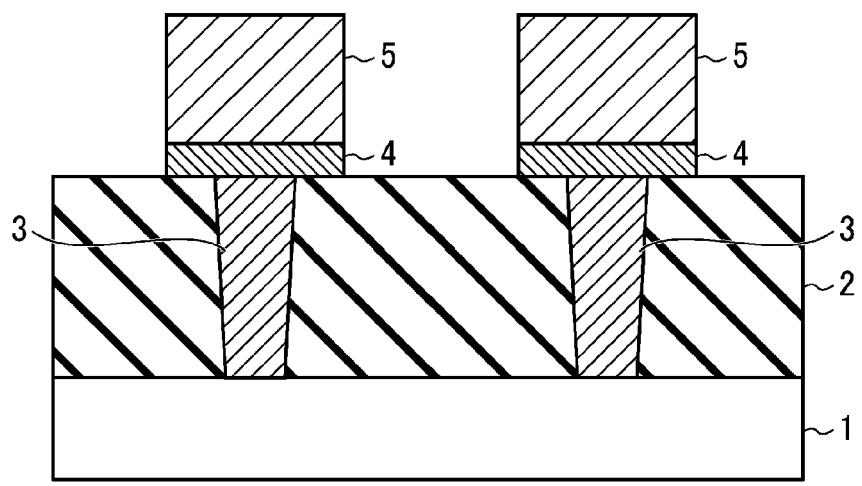
FIG. 5H is a cross-sectional process view illustrating an example of the method of manufacturing the semiconductor device of FIG. 1.

Subsequently, as illustrated in FIG. 5H, heat treatment is performed on the formed wiring pattern 14 to cause a metal silicide reaction (alloying reaction) between the metal and Si. The heat treatment is performed in an inert atmosphere or a reducing atmosphere, and the wiring layer 5 made of a metal silicide compound having a stable composition is formed by controlling the temperature. Utilizing the large grain size of the metal film formed on the graphene in a pseudo-epitaxial manner, the metal silicide compound formed by the reaction also has a large grain size. The reaction temperature varies depending on each element, but basically may be selected in accordance with a binary phase diagram of each metal and Si. Since the barrier layer 4 made of a graphene film having an excellent barrier property is disposed under the wiring pattern 14, the metal film and the Si film do not react with the underlying contact layer 3, and thus it is possible to perform a stable reaction.

Figure 5I:
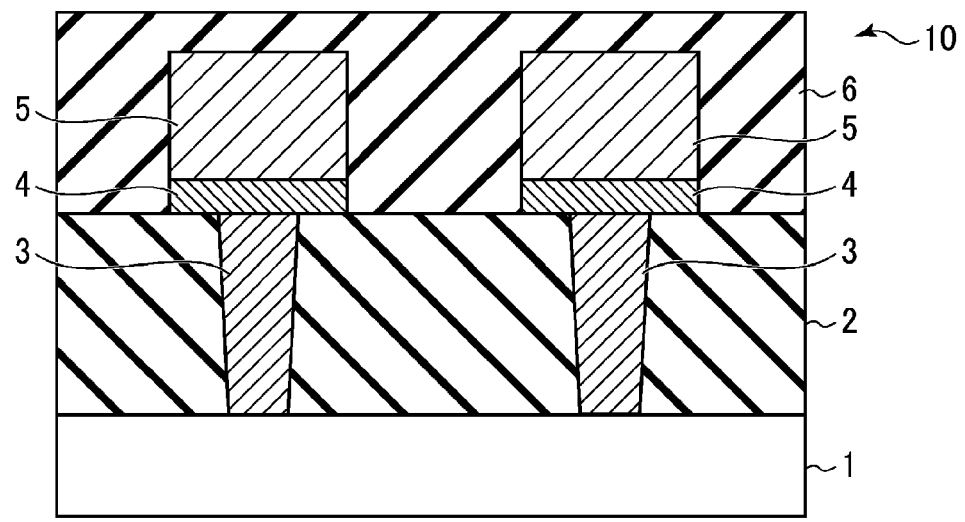
FIG. 5I is a cross-sectional process view illustrating an example of the method of manufacturing the semiconductor device of FIG. 1.

Subsequently, as illustrated in FIG. 5I, the surface protection layer 6 is formed so as to cover the wiring structure composed of the barrier layer 4 and the wiring layer 5, and the semiconductor device 10 is completed. As the surface protection layer 6, for example, a $SiO_2$ film or a SiN film may be used, and may be formed through the plasma-based CVD method. In this case, an air gap structure may be formed by intentionally using a low coverage condition as a CVD condition so as to create a void between wiring lines.

[Another Example of Semiconductor Device Manufacturing Method]

Next, another example of the method of manufacturing the semiconductor device of FIG. 1 will be described. FIGS. 6A to 6H are cross-sectional process views illustrating another example of the method of manufacturing the semiconductor device of FIG. 1.

In the above example, after the Si film 13 is formed on the metal film 12, the patterning is performed first, and then the silicidation is performed. In this example, the patterning is performed after the silicidation is performed first. The processes of FIGS. 6A to 6D are performed in exactly the same manner as the processes of FIGS. 5A to 5D in the above example.

Figure 6A:
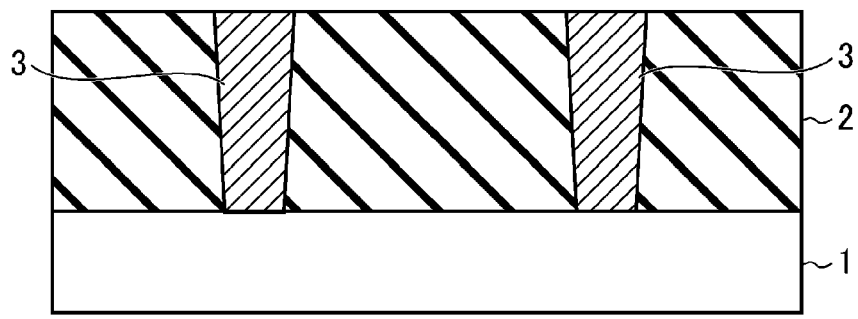
FIG. 6A is a cross-sectional process view illustrating another example of the method of manufacturing the semiconductor device of FIG. 1.
Figure 6B:
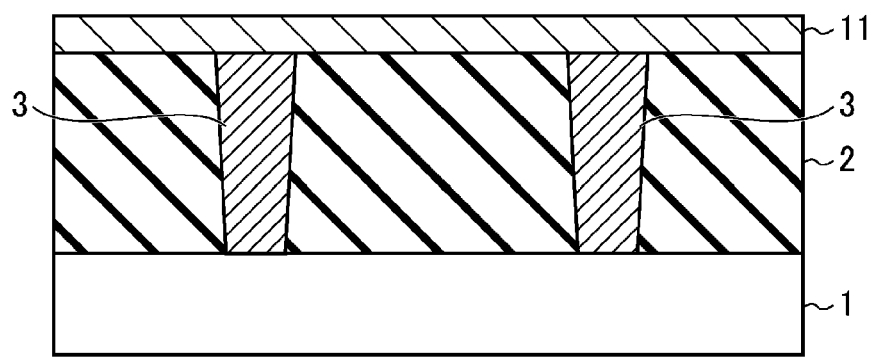
FIG. 6B is a cross-sectional process view illustrating another example of the method of manufacturing the semiconductor device of FIG. 1.
Figure 6C:
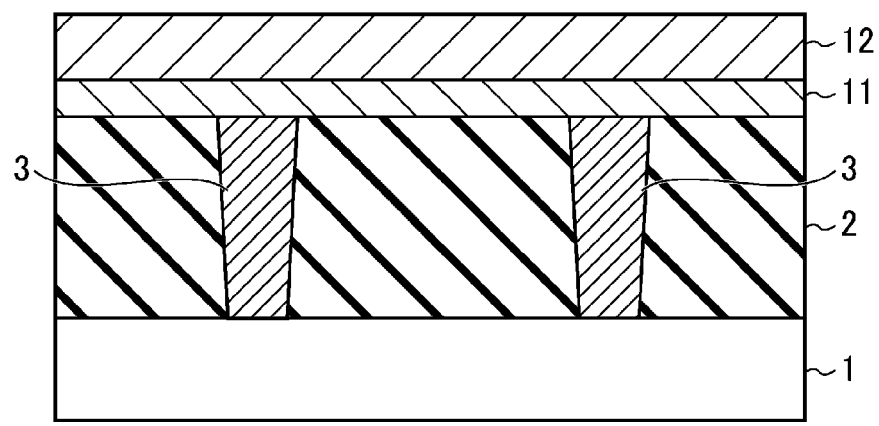
FIG. 6C is a cross-sectional process view illustrating another example of the method of manufacturing the semiconductor device of FIG. 1.
Figure 6D:
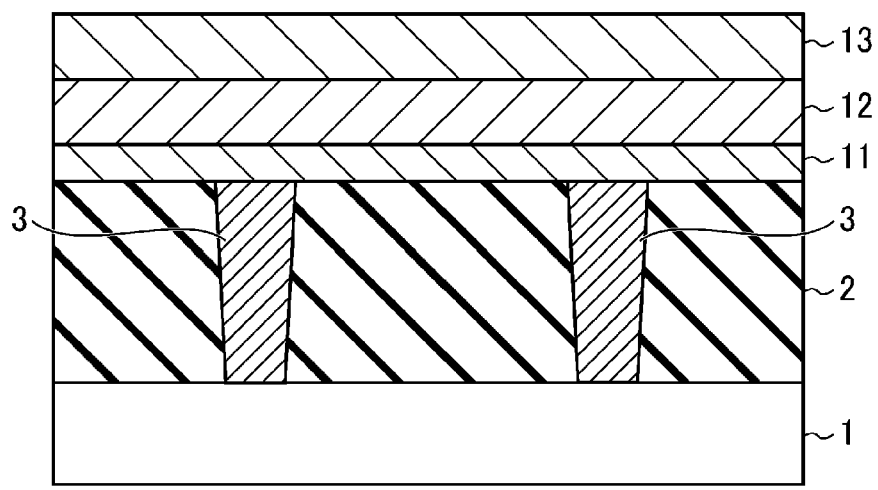
FIG. 6D is a cross-sectional process view illustrating another example of the method of manufacturing the semiconductor device of FIG. 1.
Figure 6E:
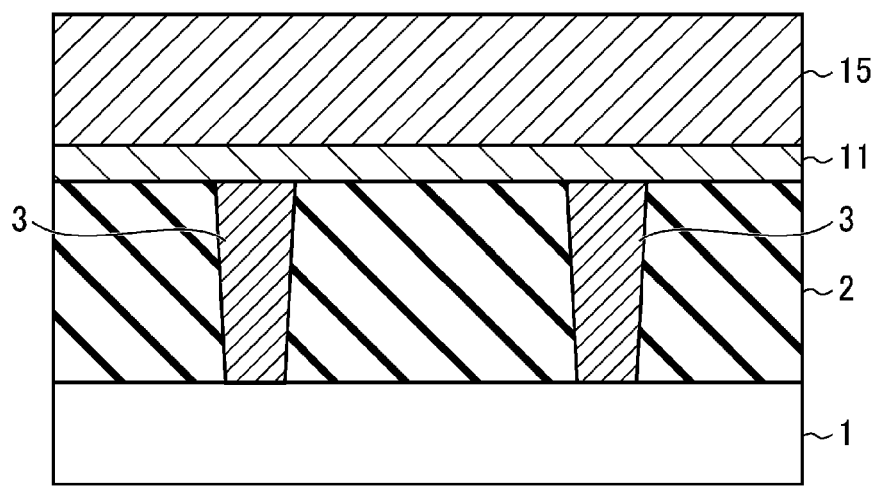
FIG. 6E is a cross-sectional process view illustrating another example of the method of manufacturing the semiconductor device of FIG. 1.

After forming the Si film 13 on the metal film 12 of FIG. 6D, as illustrated in FIG. 6E, heat treatment is performed thereon so as to cause a metal silicide reaction (alloying reaction) between the metal and Si, thereby forming a metal silicide layer 15. The conditions of the heat treatment in this case are the same as those in the process of FIG. 5H in the above example.

Figure 6F:
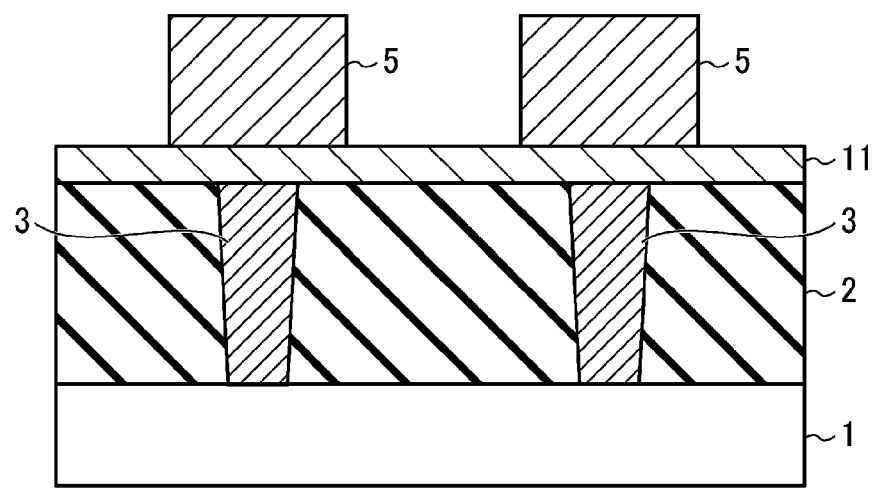
FIG. 6F is a cross-sectional process view illustrating another example of the method of manufacturing the semiconductor device of FIG. 1.

Subsequently, after performing a resist coating/lithography step (not illustrated), as illustrated in FIG. 6F, the metal silicide layer 15 is patterned by dry etching (RIE process) so as to form the wiring layer 5. The RIE process is performed using, for example, a $CF_4$ gas, a $SF_6$ gas, a $Cl_2$ gas, or the like. For the purpose of controlling the RIE shape, a TiN film, a SiN film, a $SiO_2$ film, or the like may be formed as a processing hard mask on the metal silicide layer 15.

Figure 6G:
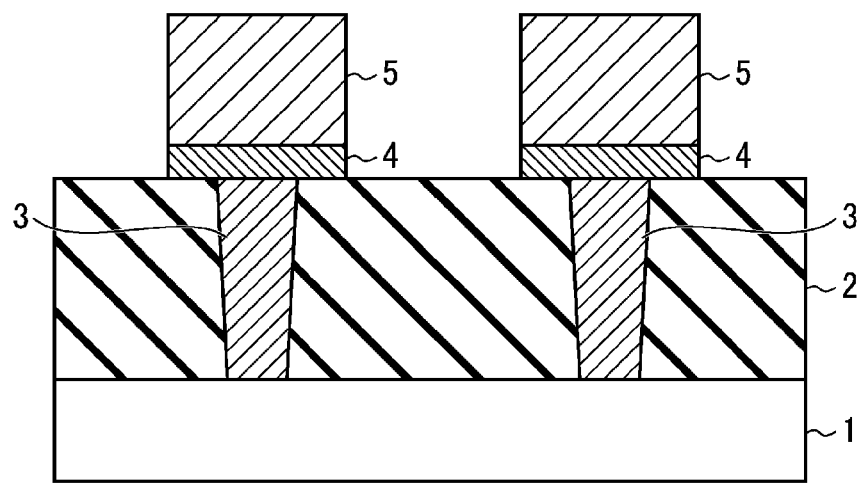
FIG. 6G is a cross-sectional process view illustrating another example of the method of manufacturing the semiconductor device of FIG. 1.
Figure 6H:
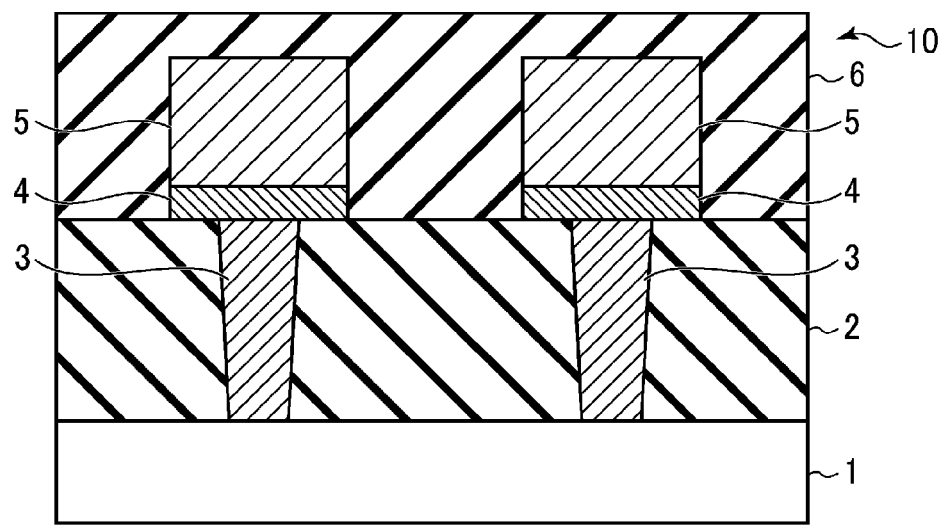
FIG. 6H is a cross-sectional process view illustrating another example of the method of manufacturing the semiconductor device of FIG. 1.

Subsequently, as illustrated in FIG. 6G, the graphene film 11 is etched as in the process of FIG. 5G in the above example. As a result, the barrier layer 4 is formed. Subsequently, as illustrated in FIG. 6H, the surface protection layer 6 is formed so as to cover the wiring structure composed of the barrier layer 4 and the wiring layer 5 as in the process of FIG. 5I of the above example.

Second Embodiment

In the second embodiment, the metal silicide compound constituting the wiring layer 5 and the front surface of the graphene film constituting the barrier layer 4 have a configuration in which a carbon bond is shared. When the metal constituting the metal silicide compound is a metal having a solid solubility limit of carbon or a metal forming a carbide, the metal may share a carbon bond with the front surface of the graphene film. Sharing the carbon bond in this way leads to an improvement in adhesion and a reduction in contact resistance.

The carbon bond may be shared between the metal film (metal element constituting the metal film) or the metal silicide compound (wiring layer) and the front surface of the graphene film during the alloying reaction of the metal silicide by heat treatment.

Third Embodiment

In the third embodiment, after the alloying of the metal silicide, a dangling bond at the end surface of the graphene film is subjected to a terminating treatment. By performing the terminating treatment on the dangling bond at the end surface of the graphene film, the conduction characteristic of the graphene is improved. A $H_2$ sintering may be used as the terminating treatment of the dangling bond. The terminating treatment of the dangling bond is not limited to the $H_2$ sintering, and may be, for example, a silylation treatment or a hydrophobic treatment by HDMS. In the silylation treatment or the hydrophobic treatment, a dangling bond is terminated by a silicon-methyl group or the like. In addition, the dangling bond terminating treatment may be performed continuously by being included as a post-treatment of the alloying of metal silicide, or by being included as a pre-treatment of the formation of the surface protection layer in the next step.

Fourth Embodiment

Figure 7:
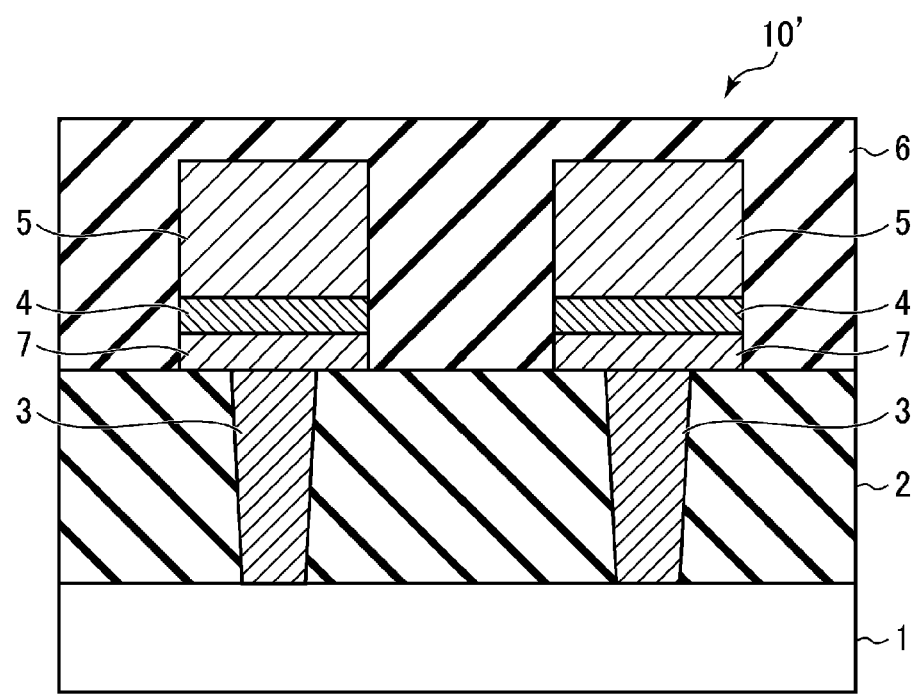
FIG. 7 is a cross-sectional view illustrating a semiconductor device according to a fourth embodiment.

FIG. 7 is a cross-sectional view illustrating a semiconductor device according to a fourth embodiment. As illustrated in FIG. 7, in a semiconductor device 10' of the fourth embodiment, the contact layer 3 includes a contact portion 7 having the same width as that of the barrier layer 4, in a portion in contact with the barrier layer 4, in addition to a plug portion in the contact layer insulating film 2. That is, the semiconductor device 10' has a configuration in which the contact portion 7 as a portion of the contact layer 3 made of poly-Si or the like, the barrier layer 4 including the graphene film, and the wiring layer 5 including the metal silicide compound are stacked one above another at the same width.

With this configuration, it is possible to enhance the barrier effect of the graphene film by forming the stable barrier layer 4 including the graphene film between the contact portion 7 of the contact layer 3 and the entire surface of the wiring layer 5 including the metal silicide compound.

It should be noted that the embodiments disclosed herein are exemplary in all respects and are not restrictive. The above-described embodiments may be omitted, replaced or modified in various forms without departing from the scope and spirit of the appended claims.

For example, the configuration of the semiconductor device is not limited to those illustrated in FIGS. 1 and 7 as long as it has a configuration including a graphene film formed between an underlying conductive layer and an upperlying metal silicide compound.

According to the present disclosure in some embodiments, it is possible to provide a semiconductor device and a method of manufacturing the same, which are capable of implementing a further lower resistance of wiring in a case where a metal silicide compound is used as the wiring.

What is claimed is:

1. A method of manufacturing a semiconductor device, the method comprising:
   forming a first conductive layer on a substrate;
   forming a graphene film on the first conductive layer;
   forming a metal film on the graphene film;
   forming a Si film on the metal film;
   forming a second conductive layer serving as a wiring layer by causing the metal film to react with the Si film so as to form a metal silicide compound to be in contact with the graphene film; and
   terminating a dangling bond on an end surface of the graphene film, after the forming the second conductive layer serving as the wiring layer,
   wherein the graphene film functions as a barrier layer provided between the first conductive layer and the second conductive layer.

2. The method of claim 1, wherein the first conductive layer is a contact layer connected to a semiconductor element formed on the substrate.

3. The method of claim 2, wherein a metal element of the metal film has a crystal structure of an FCC structure or an HCP structure, and a close-packed plane tetrahedral position distance of the metal element has a misfit constant of 15% or less with respect to a distance between adjacent carbon atoms of a six-membered ring structure of graphene.

4. The method of claim 3, wherein the metal silicide compound is at least one selected from the group of NiSi, CoSi, RuSi, $Cu_3Si$, and PtSi.

5. The method of claim 4, wherein a carbon bond is shared between the metal film or the metal silicide compound and a front surface of the graphene film when causing the metal film to react with the Si film.

6. The method of claim 1, wherein a metal element of the metal film has a crystal structure of an FCC structure or an HCP structure, and a close-packed plane tetrahedral position distance of the metal element has a misfit constant of 15% or less with respect to a distance between adjacent carbon atoms of a six-membered ring structure of graphene.

7. The method of claim 1, wherein a carbon bond is shared between the metal film or the metal silicide compound and a front surface of the graphene film when causing the metal film to react with the Si film.

* * * * *